United States Patent [19]

Harari

[11] 4,115,914

[45] Sep. 26, 1978

[54] ELECTRICALLY ERASABLE NON-VOLATILE SEMICONDUCTOR MEMORY

[75] Inventor: Eliyahou Harari, Irvine, Calif.

[73] Assignee: Hughes Aircraft Company, Culver City, Calif.

[21] Appl. No.: 770,346

[22] Filed: Feb. 22, 1977

Related U.S. Application Data

[62] Division of Ser. No. 671,183, Mar. 26, 1976.

[51] Int. Cl.² .......................................... H01L 29/78
[52] U.S. Cl. ..................................................... 29/571
[58] Field of Search ......................................... 29/571

[56] References Cited

U.S. PATENT DOCUMENTS

| 3,865,652 | 2/1975 | Agusta et al. | 148/187 |
| 4,016,588 | 4/1977 | Ohya et al. | 357/23 |

FOREIGN PATENT DOCUMENTS 49-69,091  7/1974  Japan.

OTHER PUBLICATIONS

Tickle et al; "Electrically Alterable Nonvolatile Semiconductor Memories" Session 4, 1972 Wescon Technical Papers.

Rapp; "Silicon on Sapphire" Electronics Products Magazine (1/15/73), pp. 83–84.

*Primary Examiner*—Gerald A. Dost
*Attorney, Agent, or Firm*—George Tacticos; W. H. MacAllister

[57] ABSTRACT

A non-volatile semiconductor storage device comprising a dual gate field effect transistor in which an electrically floating gate acts as a charge storage medium. An insulating layer of an appropriate dielectric material separates the floating gate from the active portion of the transistor. A predetermined section of this insulating layer is relatively thin to permit this section of the floating gate to be relatively close to a corresponding predetermined section of the transistor, thus facilitating the transfer of charges between the transistor substrate and the gate. When charges reach the floating gate either through tunneling or avalanche injection, they are entrapped and stored there, thus providing memory in the structure. That is, the electric field induced by these charges is maintained in the transistor even after the field inducing force is removed. Erasing is achieved by removing the charges from the floating gate by reverse tunneling through the relatively thinner insulator region.

12 Claims, 16 Drawing Figures

ELECTRICALLY ERASABLE NON-VOLATILE SEMICONDUCTOR MEMORY

This is a division of application Ser. No. 671,183 filed Mar. 26, 1976.

FIELD OF THE INVENTION

This invention relates generally to a non-volatile field effect memory device and the process for making same. More specifically, it relates to a dual gate field effect transistor in which one gate is electrically floating and insulated by a dielectric material from both the active portion of the transistor and its external metal gate.

BACKGROUND

Non-volatile memories are devices that can retain stored information without the use of external power sources. They are usually insulated gate field effect transistors modified so that electrical charge can be stored in the gate dielectric and thus cause a threshold change in the transistor. Such devices can be separated into two broad classes, depending on the charge storage mechanism. The first class contains devices where charges are stored in deep energy states at or near the interface between two gate dielectrics. The best known devices of this type are the MNOS (metal-silicon nitride-silicon dioxide-silicon) and the MAOS (metal-aluminum oxide-silicon dioxide-silicon) devices. Also in this class is a new and improved device disclosed in my copending application Ser. No. 645,150, filed Dec. 30, 1975, and entitled "Non-volatile Field Effect Semiconductor Memory Structure Utilizing Implanted Ions to Induce Trapping States," which is assigned to the present assignee. For devices of this first class, the conduction mechanism used to transfer charges to the storage sites from the substrate is known as "tunneling." Tunneling takes place upon the application of an appropriate control voltage pulse at the gate electrode. Tunneling is also used to remove the charges from the storage sites to their original positions upon the application of a control voltage pulse of a polarity opposite to that used for the transfer and storage of the charges initially.

The other class of these memory devices contains structures in which the charge storage takes place in a floating electrode buried in the gate dielectric. The best known device of this second class is the FAMOS (floating gate-avalanche injection-MOS) type. In a FAMOS device, charges are transferred into a floating gate by the avalanche injection of electrons from a reverse biased drain junction. A more detailed discussion of both the MNOS and the FAMOS structures is contained in a publication by Andrew C. Tickle and Frank M. Wanlass, entitled "Electrically Alterable Nonvolatile Semiconductor Memories," Session 4, 1972 Wescon Technical Papers.

PRIOR ART

A well-known prior art device is the MNOS transistor. As mentioned above, it basically consists of an insulated gate field effect transistor with two distinct gate dielectric layers. During the writing operation, charges are tunneled through the first dielectric layer (i.e. $SiO_2$) contiguous to the silicon substrate and are trapped at the interface of the two dielectrics (i.e. $Si O_2$–$Si_3N_4$). The silicon dioxide layer is very thin, in the range of 20–60 Å for fast write/erase operations, and the control voltage in the range between 25 and 50 volts. The density of the interface states created by the lattice mismatch of the two dielectrics is in the order of $10^{12}$ states/cm². Because of the small amounts of trapping sites, only a few of the charges will be captured at the interface centers. To capture more of these charges, there must be an increased current density which requires a greater write-erase voltage or a thinner $SiO_2$ layer. However, large control voltage swings restrict the usefulness of these devices in many applications and cause eventual degradation, or wearout of the devices, thus reducing their ability to store charges. Similarly, a very thin and uniform oxide is difficult to grow without pinholes or other defects. Such defects cause electrical shorts or low-resistance paths between the floating gate and the substrate, thus causing loss of charge retention. Another disadvantage of the MNOS devices is that the tunneling of charges back and forth across the thin oxide increases the density of surface states at the interface between the silicon substrate and the silicon dioxide film. As the density of surface states increases, the source-to-drain current, at a given gate voltage level, decreases and this of course means a reduced transconductance due to the effect of surface states. This somewhat limits the usefulness of these devices in that they cannot be used for more than approximately $10^6$ cycles of write-erase operations.

Another prior art device of the general type discussed above consists of a dual gate field effect transistor with one gate electrically floating. The insulating layer separating the floating gate from the substrate of this device is sufficiently thin to permit charges to tunnel through it and reach the floating gate during the writing operation and then tunnel back to the substrate during the erase operation. Such types of devices are described in U.S. Pat. Nos. 3,500,142 and 3,649,884 and possess some of the same disadvantages as the MNOS structures. They require a very thin, uniform and high quality insulator between the floating gate and the substrate, and small pinholes and other imperfections in such insulator can substantially reduce the retention time of the devices.

Figure 1:
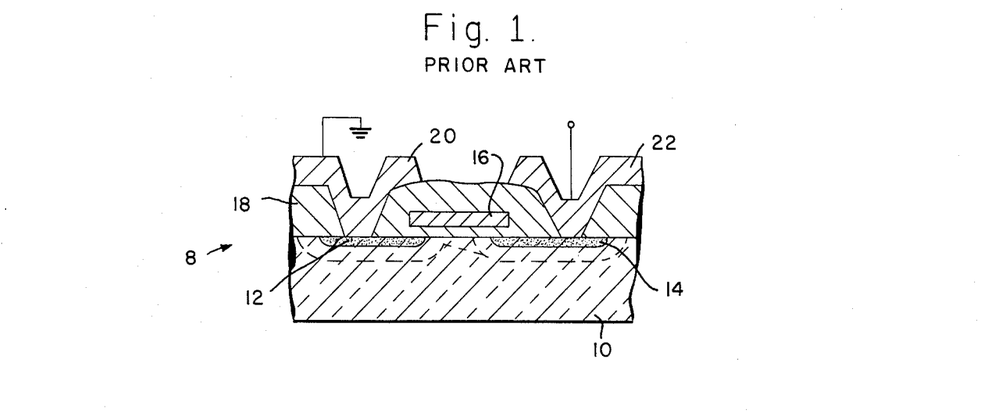
FIG. 1 is a diagrammatic cross-sectional view of a prior art non-volatile field effect memory cell.
Figure 2:
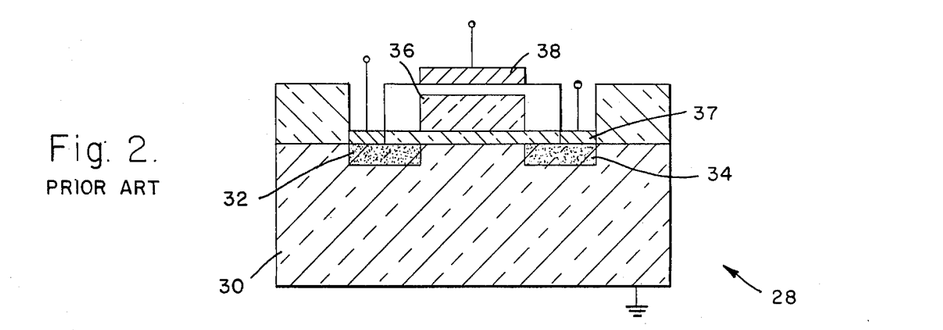
FIG. 2 is a cross-sectional view of another prior art non-volatile field effect memory cell.

Still another prior art device is the FAMOS (floating gate-avalanche injection-MOS), and one such device is described in U.S. Pat. No. 3,660,819. A diagrammatic cross-sectional view of such a structure is shown in FIG. 1, which is described in some detail at a later section of the specification. It consists of an electrically floating polysilicon or metal gate field effect transistor having an insulating layer, such as $SiO_2$, surrounding the gate. This layer can be thicker than that required for the MNOS devices, since tunneling is not used for the write or erase operations. The write operation is accomplished by transferring charges across the insulation from the substrate during an avalanche condition in the source or drain junctions of the transistor. One disadvantage of this structure is that the floating gate thereof can be discharged only by ultraviolet light or X-rays. Therefore, such devices are primarily used as Read Only Memories. U.S. Pat. No. 3,797,000 describes a device with a structure similar to that disclosed in U.S. Pat. No. 3,660,819, except that it uses a second gate electrode which, when properly biased with respect to the substrate, can achieve an avalanche breakdown in the floating gate and expel all stored charges from it. Thus, with this latter device, information written into the floating gate by the storage of electrons can be electrically erased. A diagrammatic cross-sectional view of such a structure is shown in FIG. 2, which is also described in some detail at a later section of the specification. Among the limitations of such a structure is the high voltage required to achieve an avalanche breakdown in the floating gate for the erase operation, the requirement that the floating gate be of a semiconductor material, and the requirement that the floating gate have a certain low impurity concentration.

THE INVENTION

The general purpose of this invention is to provide a new and improved non-volatile field effect memory structure and the fabrication process therefor, having most if not all, of the advantages and features of similarly employed devices and related processes, while eliminating many of the aforementioned disadvantages of prior art structures.

To accomplish this purpose, I have provided a field effect transistor storage device and fabrication process therefor wherein initially a source region and a drain region are formed on a semiconductor body of one conductivity type. An electrically floating first gate electrode is spatially disposed intermediate the source and drain regions, and a portion of this floating gate electrode is spaced closer to the semiconductor body than the remaining portion of the gate electrode. This floating gate electrode is surrounded by electrically insulating means, and a second gate electrode overlies the first gate electrode and is electrically isolated from it by the insulating means. The device further includes electrical contact means on the source and drain regions. The close proximity of a portion of the floating gate electrode to the semiconductor body makes possible the use of tunneling as a conduction mechanism for transferring charges between the floating gate and the semiconductor body.

The semiconductor body on which the above-described structure is built may be either a single semiconductor material, such as bulk silicon, or a semiconductor material such as silicon on an insulator such as sapphire. The charge transport mechanism of this structure is either tunneling or avalanche injection. The present device has a small section in the first dielectric where the dielectric thickness is small enough to permit charges to tunnel through and reach the floating gate upon the application of an appropriate control voltage on the second gate dielectric. Because of the conductive nature of the floating gate charges reaching it distribute themselves uniformly over the entire surface of the electrode. The charges will remain there, unable to move back to their original position even after the termination of the control voltage. During the erase operation, these charges can be made to tunnel back to the active portion of the transistor by the application to a second gate electrode of a control voltage of a polarity opposite to that used for writing. Therefore, this device can be operated just like a conventional MNOS device, but the floating gate allows it to trap and store many times the charges that a conventional MNOS device can trap and store. In addition, since the thin oxide is a relatively small portion of the total gate dielectric, it is easier to fabricate with fewer defects and at higher yields.

Similar to the MNOS structure, the density of the surface states increases in the area of the thin dielectric used for tunneling. But unlike the MNOS devices where the tunneling dielectric covers the total channel region, the thin tunneling dielectric occupies only a small part or no part at all of the transistor channel region of the present device. Therefore, this dielectric affects the transconductance of only a small portion of the channel width and its effect on the reading current is minimal. The retention time in my device is also greater than that of the conventional MNOS devices because the charges have a smaller section from which to tunnel back. This structure also provides a flexibility of design by affording a choice in certain applications between the characteristics of speed of writing and/or erasing on the one hand, and retention time on the other. This can be done by adjusting the ratio of total floating gate area/area of thin dielectric.

Another charge transporting mechanism that can be used with this structure is avalanche injection. This occurs during a reverse breakdown of the drain junction together with the application of bias voltage of appropriate magnitude and polarity on the external control gate (positive for avalanche injection of electrons). For example, by applying a positive voltage to the control gate, it is possible to increase the number of excess electrons on the floating gate by avalanche injection from the drain junction, and by applying a negative voltage to the control gate, it is possible to decrease the number of excess electrons on the floating gate by tunneling them out through the small area of thin dielectric. Since it is not necessary to have the area of thin dielectric near the drain junction (this is because as in the prior art FAMOS device, avalanche injection does not require a very thin dielectric), a device can be constructed wherein writing occurs by avalanche injection through one thick part of the dielectric, i.e. 500–1,000 Å, while erasing occurs by tunneling through another thinner part of the dielectric on the order of 20–100 Å.

There are three advantages of such a scheme. First the number of possible cycles can be increased since the charge transport for write and erase takes place through different regions of the dielectric. Second, lower voltages can be used for writing by avalanche injection than writing by tunneling. Finally, one bias polarity is used for write and erase operations. One disadvantage with avalanche injection from a junction breakdown, is that it is not as fast as injection by tunneling. This will limit its use to applications where a writing time of 1 millisecond or longer can be tolerated.

Another advantage of the structure embodying the invention is that it can be processed using conventional MOS technology.

A further advantage of the present invention is that it uses the same type of charge for both write and erase operations. It is well known that thermal $SiO_2$ can be grown with a very low density of electron traps, while the density of hole traps can be orders of magnitude higher, depending critically on the thermal oxidation cycle. There are some prior art devices utilizing transport of electrons for write (or erase) and transport of holes for erase (or write), but these suffer a degradation due to permanent trapping, predominantly of holes, in the oxide trapping states. The present invention achieves write and erase through the transport of electrons alone, thus minimizing this degradation mechanism.

Yet another advantage of the device in the present invention is that in the embodiments where the thin tunneling oxide overlies the heavily doped source or drain regions the circuit design for a large memory array is considerably simplified in selectively addressing individual locations, and a single bias polarity only is required for write, read and erase operations.

Using this invention, both N-channel and P-channel memory cells can be constructed with good retention properties, high write/erase speeds, and low control voltage. Although most discussion in this specification focuses around the P-channel cells, the same principles apply to the fabrication of both P and N type memory cells.

Accordingly, it is an object of the present invention to provide a new and improved non-volatile field effect memory cell.

Another object of this invention is to provide a non-volatile field effect memory cell having higher write and higher erase speeds, a higher retention time, and requiring a lower control voltage.

Another object of this invention is to provide a non-volatile memory device where either tunneling or avalanche injection or a combination of the two (i.e., avalanche injection for writing and tunneling for erasing), can be used as the charge transport mechanism depending on the application.

Another object of this invention is to provide a non-volatile memory device having a floating gate for storing trapped charges and a gate dielectric made selectively thick for efficient charge retention and also including a smaller thin section for charge tunneling to and from the floating gate.

Another object of this invention is to provide a highly reproducible and simple process for the fabrication of a non-volatile memory cell.

Another object of this invention is to provide a non-volatile memory cell that is flexible in design, can be operated with either one or both bias polarities, and is adaptable to many different applications.

Yet another object of this invention is to provide a method for controlled threshold voltage shifting in any desired region of an integrated circuit device.

These and other objects of the invention will become apparent in the following description taken in conjunction with the accompanying drawings.

DETAILED DESCRIPTION

Referring now to FIG. 1, there is shown one prior art P-channel field effect memory cell generally designated 8. The structure includes an N type silicon substrate 10 and two $P_+$ type regions 12 and 14 for the source and drain regions, respectively. It also includes a floating gate 16, made of polycrystalline silicon or aluminum, insulating means 18 such as $SiO_2$, and metal contacts 20 and 22 for the source and drain regions, respectively. The insulating means separating the floating gate 16 from the substrate 10 has a thickness typically ranging between 500 to 1000 Å. Charges are transferred from the substrate to the floating gate by the avalanche breakdown of one of the two PN junctions, the source-to-substrate junction or the drain-to-substrate junction. When the avalanche breakdown occurs under high voltage applied between source and drain, high energy electrons generated in the depletion region of the reverse-biased PN junction pass through the gate dielectric material and reach the floating gate under the influence of the fringing electric field of the PN junction. The charges are trapped and stored on the floating gate, unable to escape because of the electrical isolation of the gate. To remove these charges from the gate, the device must be subjected to X-ray radiation, or ultraviolet light, or a high temperature (e.g. 450° C.). Such a device is described in more detail in U.S. Pat. No. 3,660,819, and some of its limitations have been mentioned in the prior art section of this specification. These limitations are basically due to the relative difficulty with which the floating gate can be discharged. Because of these limitations, such devices are primarily used as Read Only Memories.

Referring now to FIG. 2, there is shown another prior art field effect memory cell generally designated 28. This structure includes an N type silicon substrate 30, and two P type regions 32 and 34 for the source and drain regions, respectively. It also includes an electrically floating gate 36, separated from the substrate by an insulating layer 37, such as $SiO_2$, having a thickness in the order of 500 Å. Charges are transferred to the floating gate 36 by the avalanche breakdown of one of the two PN junctions, just like with the device of FIG. 1. The charges can be removed by bias pulsing the substrate 30 with respect to the second gate 38, such that avalanche breakdown will occur in the charged floating gate. Such a device is taught by U.S. Pat. No. 3,797,000, and some of its limitations have been mentioned in the prior art section of this specification. These limitations are basically due to relatively high voltage pulses (in the order of 50 volts) required to remove the charges from the floating gate during the erase operation, the specially low doping densities for the floating gate, which are necessary for avalanche breakdown to occur, and the relatively slow speed with which the write/erase operations can take place.

Figure 3A:
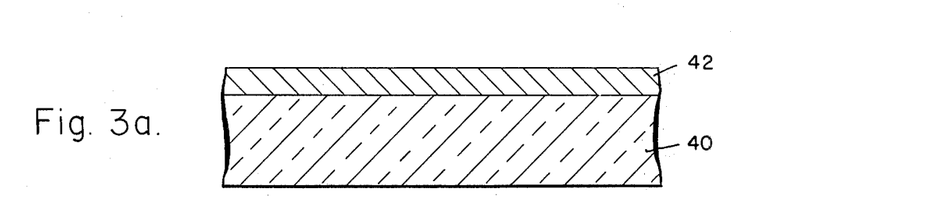
FIGS. 3a through 3i illustrate, in a series of diagrammatic cross-sectional views, a sequence of the most important process steps utilized in fabricating a non-volatile field effect memory cell in accordance with the present invention.

Referring now to FIGS. 3a through 3i, there is shown, in a series of cross-sectional views, a sequence of some of the most important process steps which may be utilized in fabricating a non-volatile field effect storage device in accordance with the present invention. In FIG. 3a, there is shown a semi-insulating silicon substrate 40 on which a thermal layer of silicon dioxide ($SiO_2$) 42 is grown to a thickness on the order of 1 μm. Portions of this oxide are removed for the active transistor regions, and the remaining oxide is used to isolate the active regions from each other. For a better isolation, this invention may be practiced by first growing heteroepitaxially a single crystal silicon layer on an insulating substrate such as sapphire, and then completely removing the silicon layer from the field regions, leaving isolated islands of single crystal silicon on a common insulating substrate. In either case, the following outlined process steps are equally applicable, whether the device is constructed on a plain semiconductor substrate such as bulk silicon, or on a semiconductor substrate grown on an insulating substrate such as sapphire. A device constructed on an insulated substrate is shown in FIG. 4 and also described in more detail at a later part of this specification.

Figure 3B:
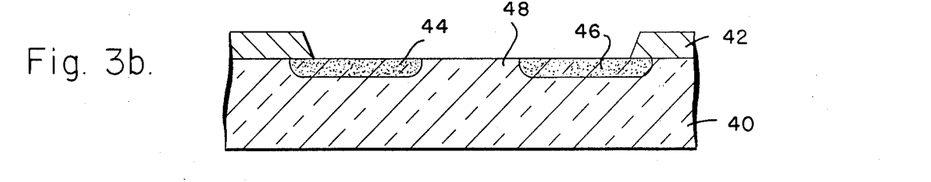
Figure 4:
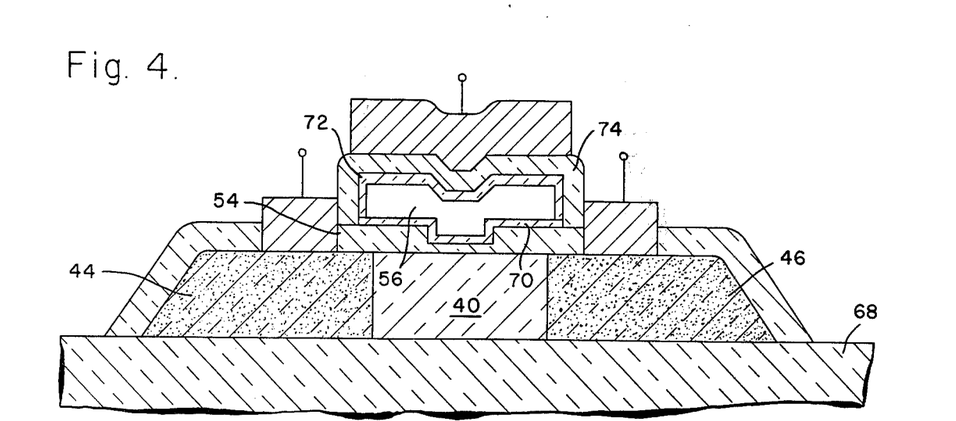
FIG. 4 is a cross-sectional view of another embodiment of this invention.

In FIG. 3b, there is shown the silicon substrate 40 and an $SiO_2$ layer 42 as illustrated in FIG. 3a, from which a portion of the $SiO_2$ layer has been removed through conventional masking and etching operations, for the formation of the active regions of the transistor. In FIG. 3b, there are further shown the active regions of the transistor, such as the source and drain regions 44 and 46, respectively, and the channel region 48. The source and drain regions are made $P_+$, for P-channel devices, through conventional diffusion or ion implantation means. In one embodiment of the invention described herein, a boron diffusion was used to form the source and drain regions of the transistor. The channel region is made $N_-$ preferably by the implantation of a light dose of phosphorous ions into the substrate 40. A masking operation is not normally required, because this dose is light and it is greatly overcompensated in the heavily doped $P_+$ source and drain regions.

Figure 3C:
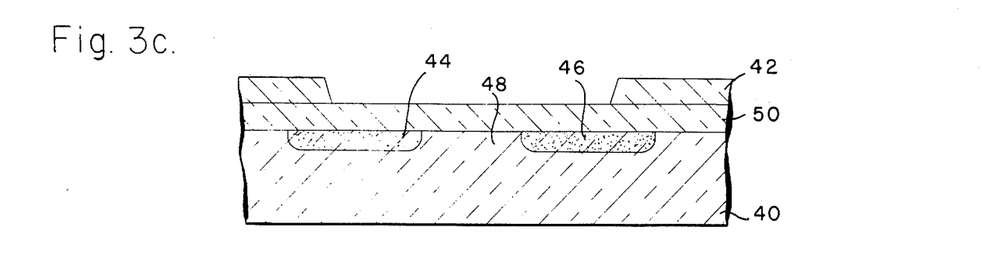

A silicon dioxide layer 50 is then grown over the entire surface of the structure as shown in FIG. 3c. Preferably this oxide is thermally grown either in a wet or a dry oxidation ambient, and at temperatures in the range of 900° to 1100° C. The thickness of this layer can vary between 300 and 1000 Å and its electrical properties are improved by a subsequent anneal in a nitrogen environment at about 1000° C. for about 20 minutes. The high temperature exposure of the device during the prior two process steps serves to further drive in and activate the dopants previously introduced into the source, the channel, and the drain regions.

Figure 3D:
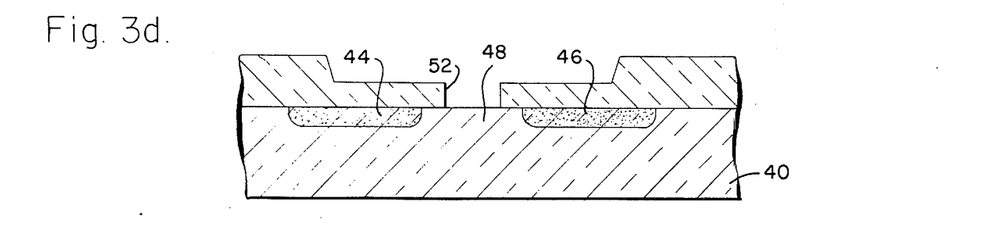
Figure 3E:
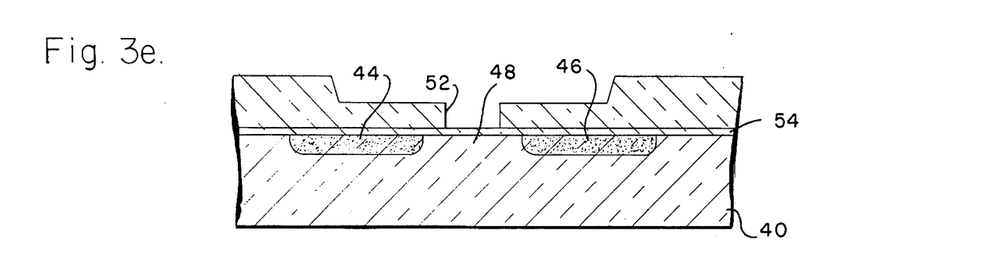
Figure 5:
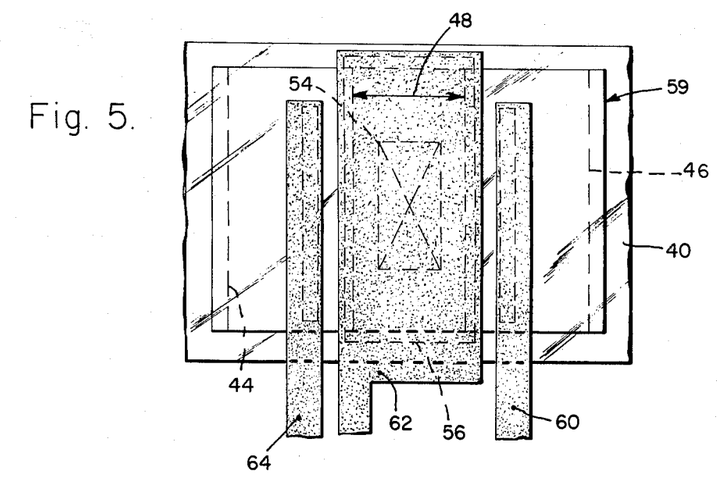
FIG. 5 shows a top view of a memory cell, a cross-sectional view of which was illustrated in FIG. 3i.
Figure 6:
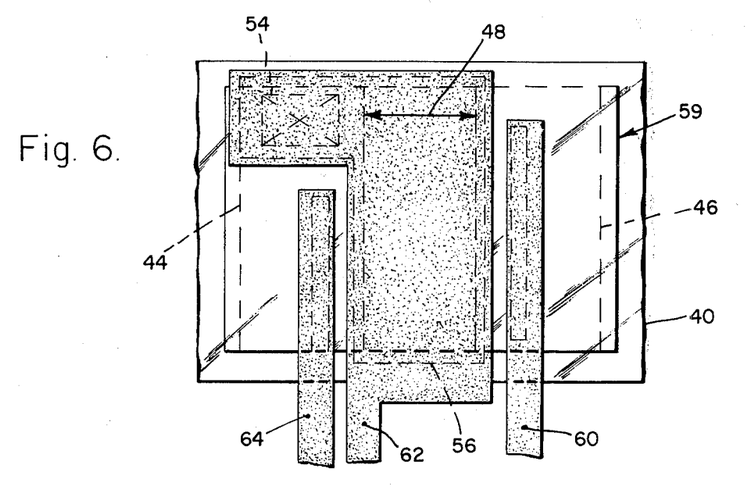
FIG. 6 is a top view of another embodiment of this invention wherein the thin gate dielectric section is formed over the source region rather than the channel region as was the case with the embodiment shown in FIG. 5.

In FIG. 3d, there is shown the processed structure after a predetermined portion 52 of the $SiO_2$ layer 50 was removed through etching to thereby expose the Si substrate surface. The location and size of this removed portion of the $SiO_2$ layer can vary depending on the desired electrical characteristics of the device. It may be made as small as can be reproducibly achieved with existing photolithography. In FIG. 3d this opening 52 in the $SiO_2$ layer 50 is shown to be over the channel region, but it may also be elsewhere, like for example over the source region or the drain region as later is shown in FIGS. 5 and 6, respectively. Next, a second thermal oxidation step is performed in order to grow a thin silicon dioxide layer 54 as is shown in FIG. 3e. This oxidation step is relatively short in duration, lasting typically 3–10 minutes, and it is usually carried out at a relatively low temperature, e.g. 850° to 950° C., in order to permit a tighter control over the oxide thickness. This oxidation may further be slowed down by providing only a dry oxygen ambient. The resulting silicon dioxide layer 54 in opening 52 will have a thickness typically in the range of 20 to 100 Å. The actual temperature and duration of oxidation can vary, depending on the desired oxide thickness in the opening 52. The increase in the thickness of the pre-existing oxide 50 is relatively small and will not significantly affect the electrical characteristics of the completed device. This oxidation may be followed by a 10 to 20 minute anneal in nitrogen atmosphere at a temperature in the range of 800° to 1100° C.

At this point the thin $SiO_2$ layer in the opening 52 may be covered by a second thin layer of a dielectric material having a higher dielectric constant than $SiO_2$. The purpose of this layer is to increase the process yield by covering up any defects such as pinholes in the thin $SiO_2$ layer that would otherwise cause electrical shorts and possibly destroy the device. The thickness of this second dielectric layer may range between 100 and 200 Å. Among the different dielectrics that can be used for this purpose are silicon nitride, aluminum oxide, and titanium oxide ($Si_3N_4$, $Al_2O_3$ and $TiO_2$). This layer is not included in the attached drawings because it is only an optional feature of this invention which may be used to increase process yields at the expense of higher operating voltages.

Figure 3F:
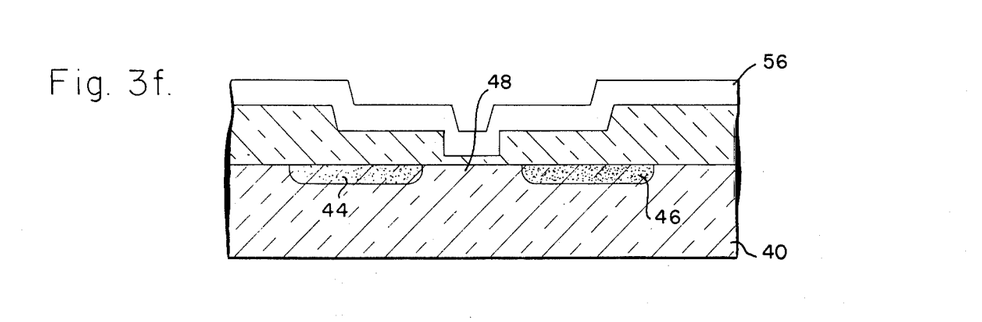

The next process step is the formation of the floating gate. For this purpose a layer 56 of a resistive material, such as polycrystalline silicon, is deposited over the entire surface of the device as shown in FIG. 3f. The deposited polycrystalline silicon layer 56 may be pre-doped or it may be doped after deposition through a conventional diffusion process. It may also be left undoped. In addition to polycrystalline silicon there are other resistive materials, such as molybdenum or other refractory metals, that may also be used for the floating gate material.

Figure 3G:
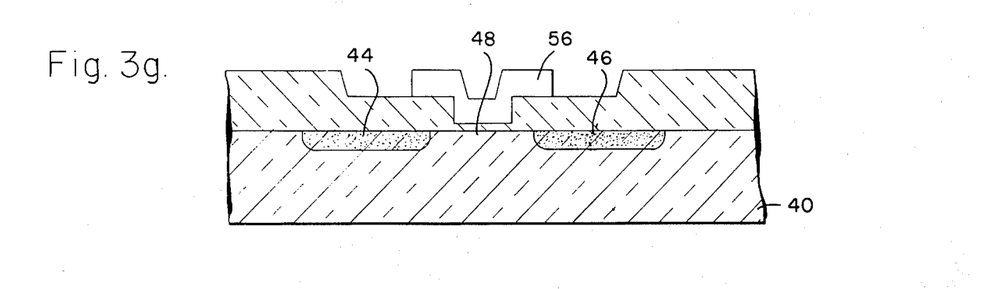
Figure 3H:
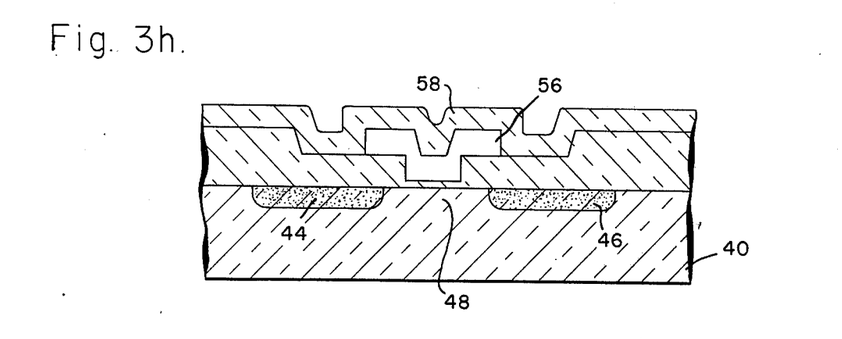

In FIG. 3g there is shown the floating gate 56 after its definition and the etching away of the polycrystalline silicon from everywhere but the channel region. It is not necessary for the floating gate to overlap the source or drain diffusions but it must extend across the entire width of the channel region. The polycrystalline silicon can also be used as a diffusion or implantation mask to form self-aligned source and drain regions. Then the polycrystalline silicon 56 is oxidized for electrical isolation from the second gate electrode which is to be formed in the gate region during a subsequent process step. This oxidation step is similar to the previously described oxidation process steps, wherein the structure is subjected to a wet or a dry oxidation ambient at temperatures typically between 900° to 11° C., and this is followed by an optional anneal cycle at about 1000° C. in a nitrogen environment for about 20 minutes. FIG. 3h shows the new layer 58 of $SiO_2$. For better isolation and improvement in the process yield, the isolation of the floating gate 56 may be accomplished in two steps. One will be a short oxidation growth of a thin $SiO_2$ layer, typically in the order of 100 to 300 Å, and this layer is covered with another layer of a deposited insulator having a dielectric constant higher than that of the thermal $SiO_2$, such as $Si_3N_4$, $Al_2O_3$, or $TiO_2$.

If a refractory metal such as molybdenum is preferred instead of polycrystalline silicon to make the floating gate electrode, then a layer of another dielectric material such as $Si_3N_4$ may be deposited over the gate in order to serve as the electrical insulation for the gate.

Figure 3I:
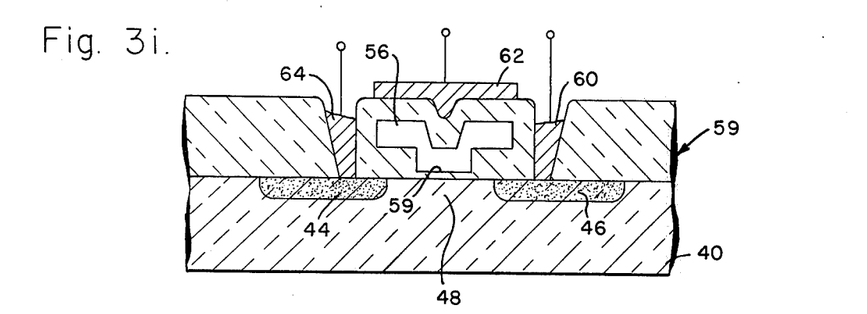

The next step in the present process is to make openings, using conventional masking and etching techniques, for the source and drain ohmic contacts. Then a layer of aluminum is deposited on the order of 1 $\mu m$ thick, and the desired metallization pattern is defined through conventional masking and metal etching techniques. If the floating gate does not overlap the source and drain then the aluminum gate must be defined to overlap these two regions and cover the entire channel area. In FIG. 3i, there is shown a completed structure including metal contacts 60 and 64 for the drain and source regions, respectively, the second gate electrode 62, which often is referred to as the control gate electrode, and isolation oxide layer 59.

In FIG. 4 there is shown a cross-sectional view of another embodiment of this invention. It is a similar structure to that shown in FIG. 3i, with the addition of an insulating substrate such as sapphire 68 on which the semiconductor body of the device is built, a thin layer of thermal oxide 75, a thin dielectric layer 70 of a material having a higher dielectric constant than that of $SiO_2$, a thin $SiO_2$ layer 72 over the polycrystalline silicon gate 56, and a new dielectric layer 74 over the $SiO_2$ layer 72, made of a material having a higher dielectric constant than that of $SiO_2$.

In FIG. 5 there is shown a top view of the device of FIG. 3i, and in this structure the thin gate dielectric region is formed over the channel region.

In FIG. 6 there is shown a top view of a slightly different embodiment of this same invention. The only difference between this embodiment and the one given in FIGS. 3a and 5 is that the thin dielectric layer 54 is formed over the source region rather than over the channel region.

Figure 7:
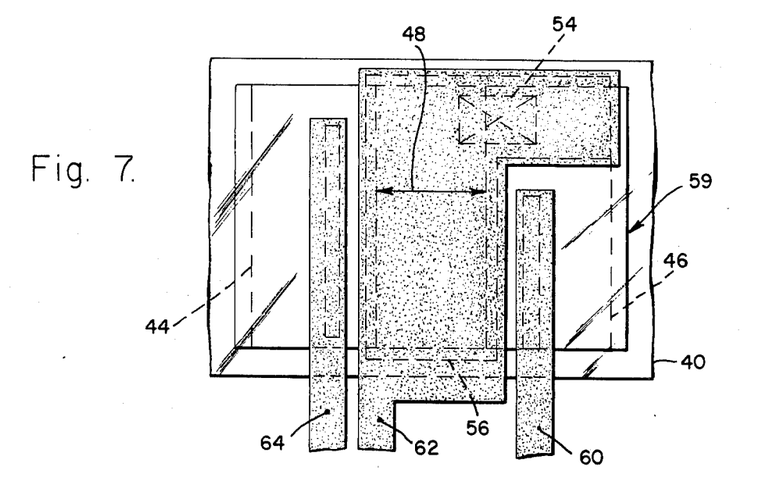
FIG. 7 is a top view of another embodiment of this invention wherein the thin gate dielectric section is formed over the drain junction region partially overlying the drain diffusion and the channel region.

FIG. 7 illustrates a top view of another embodiment of this invention wherein the thin gate dielectric section is formed over the drain junction region, that is, it lies partly over the channel and partly over the drain diffusion.

Figure 8:
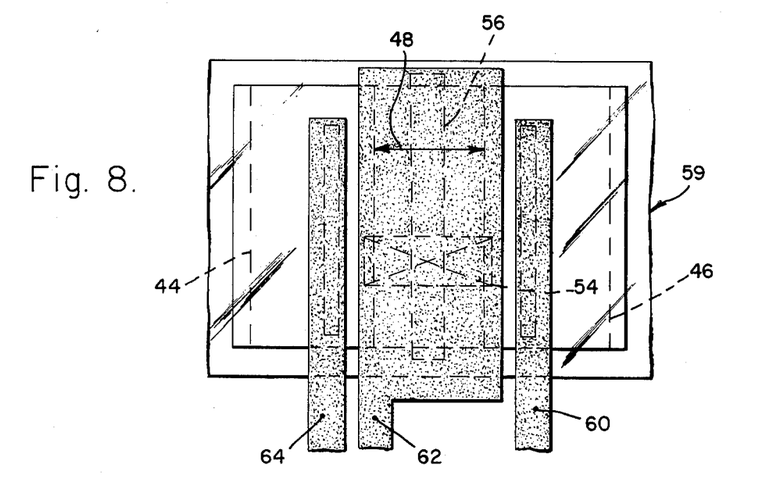
FIG. 8 is a top view of still another embodiment of this invention wherein the floating gate is narrower than the channel region and the thin dielectric region is selfaligned with the floating gate.

In FIG. 8 there is shown a top view of another embodiment of this invention wherein the floating gate 56 is made narrower than the channel region and the thin dielectric region is initially made wider than the floating gate. But during the oxidation of the polycrystalline silicon of the floating gate, the portions of the thin $SiO_2$ not covered by the floating gate become increased in thickness, leaving a remaining thin $SiO_2$ layer having exactly the same width as the floating gate. In this embodiment it is necessary for the control gate to completely extend across the channel region and slightly overlap the source and drain diffusions.

While the invention has been described in connection with a preferred sequence of process steps used to fabricate a basic field effect memory structure, it will be understood that the invention is not limited to those particular process steps, their sequence, or the final structures depicted in the drawings. On the contrary, it is intended to cover all alternatives, modifications and equivalents, as may be included within the spirit and scope of the invention as defined by the appended claims.

What is claimed is:

1. A process for fabricating a nonvolatile field effect transistor storage device comprising the steps of:
   (a) forming active field effect transistor regions, including a source region, a channel region, and a drain region, in a semiconductor substrate;
   (b) forming a first layer of a dielectric material on top of said active field effect transistor regions having a relatively thin section therein spatially disposed entirely over one of said active field effect transistor regions;
   (c) forming a layer of resistive material on top of said dielectric layer and extending over said relatively thin section to thereby form a first gate electrode;
   (d) forming a second dielectric layer up to 300Å thick on top and around said resistive material thereby electrically isolating said first gate electrode and making it a floating gate electrode;
   (e) forming a second gate electrode on top of said new dielectric layer and spatially disposed over said first gate electrode and covering the entire length of said channel region.

2. A process as set forth in claim 1 wherein said process step forming a first layer of a dielectric material on top of said active field effect transistor regions having a relatively thin section therein includes:
   (a) forming a first layer of a dielectric material on top of said active field effect transistor regions;
   (b) selectively removing a predetermined portion of said first dielectric layer over a predetermined portion of one of said transistor regions;
   (c) forming a new and relatively thin dielectric layer over said predetermined portion where said first dielectric layer when removed having a predetermined thickness that would permit under the appropriate biasing conditions the transfer of charge carriers between said substrate and said floating gate electrode by tunneling.

3. A process as set forth in claim 2 wherein:
   (a) said active field effect transistor regions are formed on silicon;
   (b) said first dielectric layer is silicon dioxide;
   (c) said relatively thin section in said first dielectric layer is formed by completely etching away the silicon dioxide from a predetermined area of said layer;
   (d) said new and relatively thin dielectric section is silicon dioxide thermally grown on top of said substrate;
   (d) said resistive material used to form said first gate electrode is polycrystalline silicon;
   (f) said second dielectric material formed to electrically isolate said first gate electrode is silicon dioxide.

4. A process as set forth in claim 3 which further includes the step of forming a protective dielectric layer on top of said relatively thin silicon dioxide layer in said first gate dielectric wherein said dielectric layer belongs to a species selected from a group consisting of silicon nitride, aluminum oxide and titanium oxide.

5. A process as set forth in claim 3 which further includes the step of forming a protective dielectric layer having a higher dielectric constant than that of silicon dioxide on top of said silicon dioxide layer insulating the floating gate from the second gate electrode.

6. A process for fabricating a field effect transistor storage device comprising the steps of:
   (a) growing heteroepitaxially a single crystal semiconductor layer on an insulating substrate;
   (b) defining active field effect transistor regions, including a source region, a gate region, a gate region and a drain region for each transistor on said semiconductor layer;
   (c) etching away all semiconductor material between said trainsistors whereby establishing an array of electrically isolated field effect transistors on an insulating substrate;
   (d) forming a first gate dielectric layer on each of said transistors;
   (e) selectively removing a predetermined portion of said first dielectric layer establishing an opening in said dielectric entirely over an active field effect transistor region;

(f) forming a new and relatively thin dielectric layer partially filling said opening having a thickness in the range between 20 and 100 Å;

(g) forming a first gate electrode adjacent to said first gate dielectric whereby a portion of said electrode extends into said opening;

(h) forming a second gate dielectric layer adjacent to said first gate electrode and having a thickness of less than 300 Å whereby said second gate dielectric layer connects with the first gate dielectric to electrically isolate said first gate electrode thus forming it into an electrically floating gate electrode;

(i) forming a second gate electrode adjacent to said second gate dielectric and overlying said floating gate electrode;

(j) forming ohmic contact means on top surfaces of said source and drain regions.

7. A process for fabricating a field effect transistor storage cell comprising the steps of:

(a) forming a layer of silicon dioxide on a semi-insulating silicon substrate;

(b) selectively removing a portion of said silicon dioxide layer for active transistor region;

(c) defining source, channel and drain regions;

(d) doping said source and drain regions P+ type, using an appropriate impurity;

(e) lightly doping said channel region N− using an appropriate impurity;

(f) forming a first gate dielectric layer by growing a layer of silicon dioxide on top of said channel region and extending over parts of said source and drain regions and having a thickness approximately 500 to 1,000 Å by oxidizing said substrate at temperatures ranging between 900° and 1,100° C.;

(g) annealing said structure in nitrogen at approximately 1,000° C. for about 20 minutes;

(h) etching an opening in said first gate dielectric in a predetermined region exposing said substrate;

(i) growing a second silicon dioxide layer by oxidizing said substrate at a temperature ranging typically between 800° to 950° C. for about 3–10 minutes whereby said opening in the first gate dielectric is thus covered by a thin silicon dioxide layer having a thickness ranging between 20 to 100 Å;

(j) forming by deposition a polycrystalline silicon layer over said first gate dielectric having a thickness in the range of 3,000 to 5,000 Å;

(k) defining a first gate electrode on said polycrystalline layer and etching remaining portions of polycrystalline silicon whereby said gate electrode extends over the entire channel region and over predetermined portions of said source and drain regions and covers said thin silicon dioxide region;

(l) forming by thermal oxidation a new layer of silicon dioxide between 100 and 300 Å in thickness over said first gate electrode, whereby said gate electrode is entirely within silicon dioxide material and thus electrically floating;

(m) forming a second gate electrode on top of said new layer of silicon dioxide and overlying said floating gate; and (n) forming ohmic contacts on said source and drain regions.

8. A process as set forth in claim 1 which includes the further step of forming by deposition a layer of a dielectric material having a higher dielectric constant than silicon dioxide on top of said silicon dioxide layer separating said polycrystalline layer from said second gate electrode.

9. In a process for fabricating a nonvolatile field effect transistor storage device having the steps of forming a field effect transistor portion including a source, a channel and a drain region in a semiconductor substrate forming a first dielectric layer adjacent to said field effect transistor portion, forming an electrically floating gate electrode adjacent to said first dielectric layer, forming a second dielectric layer adjacent to said floating gate electrode, forming a control gate electrode adjacent to said second dielectric layer, the improvement which comprises the steps of:

(a) removing a predetermined portion of said first dielectric layer entirely over one of said active transistor regions to form an aperture in said first dielectric layer prior to forming said floating gate electrode;

(b) growing a new and relatively thin layer of dielectric material in said aperture and underneath said first dielectric layer, thus establishing a dielectric layer formed in two steps and having a recess of predetermined size and location and which under appropriate biasing conditions permits the transfer of charge carriers between said floating gate electrode and said substrate by tunneling; and (c) forming said floating gate electrode whereby a portion of said electrode protrudes into said recess of said dielectric.

10. In a process as set forth in claim 9 wherein the improvement further includes the process step of forming after the second dielectric layer an additional dielectric layer having a different dielectric constant than that of said second dielectric layer, between said floating gate electrode and said control gate electrode.

11. In a process as set forth in claim 10 wherein said recess in said first dielectric layer is formed over said source region.

12. In a process as set forth in claim 11 wherein the improvement further includes the step of forming a protective dielectric layer with a different dielectric constant than said first dielectric layer, formed adjacent to said relatively thin section of said first dielectric layer and inside said recess of said first dielectric layer.

* * * * *